(12) United States Patent
Okumura et al.

(10) Patent No.: US 9,595,458 B2
(45) Date of Patent: Mar. 14, 2017

(54) PLASMA PROCESSING APPARATUS AND METHOD, AND METHOD OF MANUFACTURING ELECTRONIC DEVICE

(71) Applicant: Panasonic Intellectual Property Management Co., Ltd., Osaka (JP)

(72) Inventors: Tomohiro Okumura, Osaka (JP); Satoshi Suemasu, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/131,816

(22) Filed: Apr. 18, 2016

(65) Prior Publication Data

US 2016/0358793 A1    Dec. 8, 2016

(30) Foreign Application Priority Data

Jun. 2, 2015   (JP) .................................. 2015-111883

(51) Int. Cl.
*H01L 21/67* (2006.01)
*H01J 37/32* (2006.01)
*C23C 16/50* (2006.01)

(52) U.S. Cl.
CPC ........ *H01L 21/67069* (2013.01); *C23C 16/50* (2013.01); *H01J 37/32009* (2013.01);
(Continued)

(58) Field of Classification Search
CPC .............................................. H01L 21/67069
See application file for complete search history.

(56) References Cited

U.S. PATENT DOCUMENTS

| 3,324,334 A | * | 6/1967 | Reed | ........................ | H05H 1/30 |
|  |  |  |  |  | 219/121.11 |
| 4,897,282 A | * | 1/1990 | Kniseley | ................. | C23C 4/137 |
|  |  |  |  |  | 250/492.21 |

(Continued)

FOREIGN PATENT DOCUMENTS

| JP | 2003-100646 | 4/2003 |
| JP | 2012-104578 | 5/2012 |

(Continued)

OTHER PUBLICATIONS

T. Okumura and H. Kawaura, "Elongated Inductively Coupled Thermal Plasma Torch Operable at Atmospheric Pressure", Jpn. J. Appl. Phys. 52 (2013) 05EE01.

(Continued)

*Primary Examiner* — Caridad Everhart
*Assistant Examiner* — Ankush Singal
(74) *Attorney, Agent, or Firm* — Panasonic IP Management; Kerry S. Culpepper (57) ABSTRACT

In an inductively coupled plasma torch unit, two coils, a first ceramic block, and a second ceramic block are arranged, and an annular chamber is provided. Plasma generated in the chamber is ejected toward a substrate through an opening in the chamber. The chamber and the substrate are caused to relatively move having an orientation perpendicular to a longitudinal direction of the opening, thereby processing the substrate. A shield cylinder is disposed around the coil inside a rotating cylindrical ceramic tube, thereby making it possible to achieve compatibility of ignitibility and shielding properties.

8 Claims, 6 Drawing Sheets

(52) U.S. Cl.
CPC ..... *H01J 37/3244* (2013.01); *H01J 2237/332* (2013.01); *H01J 2237/334* (2013.01)

(56) References Cited

U.S. PATENT DOCUMENTS

| | | | |
|---|---|---|---|
| 7,578,946 B2* | 8/2009 | Ikeda | H01J 37/321 |
| | | | 156/345.48 |
| 8,450,819 B2 | 5/2013 | Okumura et al. | |
| 2005/0194099 A1* | 9/2005 | Jewett, Jr. | H01J 37/321 |
| | | | 156/345.48 |
| 2008/0141939 A1* | 6/2008 | Gillard | H01J 37/3266 |
| | | | 118/723 MA |
| 2010/0096084 A1* | 4/2010 | Lee | H01L 21/67069 |
| | | | 156/345.33 |
| 2011/0204023 A1* | 8/2011 | Huh | H01J 37/321 |
| | | | 216/37 |
| 2011/0272592 A1* | 11/2011 | Kellogg | H01J 27/16 |
| | | | 250/396 R |
| 2012/0031562 A1 | 2/2012 | Setsuhara et al. | |
| 2012/0080148 A1* | 4/2012 | Zhang | H01J 37/08 |
| | | | 156/345.3 |
| 2012/0115317 A1 | 5/2012 | Okumura et al. | |
| 2012/0261390 A1* | 10/2012 | Boulos | H05H 1/28 |
| | | | 219/121.49 |
| 2012/0273130 A1* | 11/2012 | Drewery | H01J 37/32651 |
| | | | 156/345.3 |
| 2012/0325777 A1* | 12/2012 | Okumura | H05H 1/30 |
| | | | 216/68 |
| 2013/0115780 A1 | 5/2013 | Okumura et al. | |
| 2013/0146564 A1* | 6/2013 | Okumura | B44C 1/227 |
| | | | 216/68 |
| 2014/0210337 A1 | 7/2014 | Setsuhara et al. | |
| 2014/0220784 A1 | 8/2014 | Okumura et al. | |
| 2015/0136735 A1* | 5/2015 | Okumura | H01J 37/32522 |
| | | | 216/68 |
| 2015/0221475 A1* | 8/2015 | Okumura | H01J 37/321 |
| | | | 438/710 |
| 2015/0325455 A1* | 11/2015 | Kitagawa | H01L 21/6776 |
| | | | 438/798 |
| 2016/0086774 A1* | 3/2016 | Okumura | H01J 37/321 |
| | | | 438/710 |
| 2016/0280608 A1* | 9/2016 | Foret | C04B 37/001 |
| 2016/0293455 A1* | 10/2016 | Okumura | H01J 37/32009 |

FOREIGN PATENT DOCUMENTS

| | | |
|---|---|---|
| JP | 2013-120633 | 6/2013 |
| JP | 2013-120684 | 6/2013 |
| JP | 2013-120685 | 6/2013 |
| WO | 2010/104122 | 9/2010 |
| WO | 2013/030953 | 3/2013 |

OTHER PUBLICATIONS

Yoshito Fukumoto and Shingo Sumie, "Development of Plasma Charge-up Damage Evaluation Wafers" R&D Kobe Steel Engineering Reports/vol. 52 No. 2 pp. 83-86 (Sep. 2002).

* cited by examiner

PLASMA PROCESSING APPARATUS AND METHOD, AND METHOD OF MANUFACTURING ELECTRONIC DEVICE

CROSS-REFERENCE TO RELATED APPLICATION

The present application claims the benefit of foreign priority of Japanese patent application No. 2015-111883 filed on Jun. 2, 2015, the contents of which are incorporated herein by reference.

TECHNICAL FIELD

The technical field relates to a plasma processing apparatus and plasma processing method and a method of manufacturing an electronic device. In particular, the technical field relates to thermal plasma processing in which a substrate is irradiated with thermal plasma and the substrate is subjected to the processing, or low-temperature plasma processing in which a substrate is irradiated with plasma using a reactant gas or is irradiated with the plasma and flow of the reactant gas at the same time and the substrate is subjected to the processing.

BACKGROUND

In the related art, a semiconductor thin film of polycrystalline silicon (poly-Si) or the like is widely used for a thin film transistor (TFT) or a solar cell. As a method of forming the film at a low cost, an amorphous silicon film is irradiated with a laser beam to be crystallized. A laser process can be also applied to activation of impurity atoms introduced to a semiconductor substrate by ion implantation or plasma doping. However, in the laser annealing technology, problems arise in that an end-point temperature varies depending on the magnitude of light absorption of a heating-target object or a joint line appears, or significantly high-cost equipment is required.

Therefore, technology, in which elongated thermal plasma is generated and scanning is performed only in one direction, thereby making it possible to perform heating without dependence on the light absorption of the heating-target object, or thermal processing is performed at a few cost without the joint line, has been studied (for example, see Japanese Patent Unexamined Publication No. 2013-120633, Japanese Patent Unexamined Publication No. 2013-120684, Japanese Patent Unexamined Publication No. 2013-120685, and Jpn. J. Appl. Phys. 52 (2013) 05EE01, by T. Okumura and H. Kawaura).

However, a common problem in the plasma processing is so-called electrostatic damage. The electrostatic damage is a problem in that an equilibrium state of an electron current and an ion current flowing to the heating-target object (substrate) is locally disturbed due to spatial heterogeneity of plasma and electric charge is accumulated. As a result, in a case where the substrate contains a transistor, problems arise in that a gate insulating film is degraded due to tunnel current and a dielectric strength voltage becomes lower or a voltage of a flat band voltage is changed (for example, see "Development of plasma charge-up damage evaluation wafers" in Kobe Steel Engineering Reports, Vol. 52 (2002) p. 83 by Yoshito Fukumoto and Shingo Sumie).

In capacitively coupled low-temperature atmospheric pressure plasma used in surface cleaning or the like, there is a method called a remote type in which it is possible to suppress an increase in the electrostatic damage. When a direct type, in which the substrate is disposed inside a plasma space, is compared to the remote type, in which the substrate is disposed outside the plasma space, the remote type is considered as posing a smaller risk of electrostatic damage (for example, see Japanese Patent Unexamined Publication No. 2003-100646).

SUMMARY

However, the inventors of this application have found that, in a method in which an annular chamber, which is disclosed in Japanese Patent Unexamined Publication No. 2013-120633, Japanese Patent Unexamined Publication No. 2013-120684, Japanese Patent Unexamined Publication No. 2013-120685, and Jpn. J. Appl. Phys. 52 (2013) 05EE01, by T. Okumura and H. Kawaura, is used, a problem arises in that the electrostatic damage occurs in a substrate due to a high-frequency electromagnetic field generated by a coil. In addition, multiple unstable streamer discharges are produced to have an orientation perpendicular to the line direction of linear thermal plasma (plasma in the vicinity of an opening) applied to the substrate, and result in a defective phenomenon such as arcing. In comparison, the capacitively coupled low-temperature atmospheric pressure plasma, which is disclosed in "Development of plasma charge-up damage evaluation wafers" in Kobe Steel Engineering Reports, Vol. 52 (2002) p. 83 by Yoshito Fukumoto and Shingo Sumie, has a low temperature (less than 1000° C.) of the plasma, and is not suitable for thermal processing or fast reaction.

In view of the above problems, as well as other concerns, a concern of the present disclosure is to provide a plasma processing apparatus and method in which it is possible to suppress an increase in electrostatic damage and streamer discharges.

A plasma processing apparatus of a first aspect uses an inductively coupled plasma torch, the apparatus includes: an annular chamber that has a linear opening, is surrounded by a dielectric member except for the opening, and communicates with the opening; a coil provided in the vicinity of the chamber; a power supply connected to the coil; and a substrate mounting stage.

A shield, which is formed of multiple conductor lines arranged to have an orientation intersecting with a direction of a line formed by the coil, is provided around a wire constituting the coil.

In this configuration, it is possible to suppress an increase in electrostatic damage and streamer discharges.

In the plasma processing apparatus of the first aspect, it is desirable that a portion constituting a surface of the dielectric member surrounding the chamber, which faces the substrate mounting stage, is formed of a cylinder disposed parallel to the line direction of the opening.

In this configuration, it is possible to perform rapid processing.

In addition, it is desirable that a part of the coil is disposed in a cavity inside the cylinder.

In this configuration, it is possible to perform more rapid processing.

In addition, it is desirable that the shield is grounded through a variable capacitor.

In this configuration, it is possible to perform stable plasma processing.

In addition, it is desirable that the cylinder is configured to be rotatable around the coil.

In this configuration, it is possible to perform more rapid processing.

A plasma processing method of a second aspect includes: supplying a gas into an annular chamber surrounded by a dielectric member; ejecting a gas toward a substrate from a linear opening that communicates with the chamber; and supplying high-frequency power to a coil, thereby generating a high-frequency electromagnetic field in the chamber, generating plasma, and processing a surface of the substrate.

A shield, which is formed of multiple conductor lines arranged to have an orientation intersecting with a direction of a line formed by the coil, is disposed around a wire constituting the coil.

In this configuration, it is possible to suppress an increase in electrostatic damage and streamer discharges.

A method of manufacturing an electronic device of a third aspect uses the plasma processing method described above.

In this configuration, it is possible to suppress an increase in electrostatic damage and streamer discharges.

Accordingly, when high-temperature thermal processing is performed on the vicinity of a surface of a substrate only for a short period of time, or when a substrate is irradiated with plasma using a reactant gas or is irradiated with the plasma and flow of the reactant gas at the same time and the substrate is subjected to plasma processing, it is possible to suppress an increase in electrostatic damage and streamer discharges.

BRIEF DESCRIPTION OF THE DRAWINGS

FIG. 3 is a sectional view illustrating a configuration of a plasma processing apparatus according to Embodiment 4.

DETAILED DESCRIPTION OF PREFERRED EMBODIMENTS

Hereinafter, a plasma processing apparatus according to various exemplary embodiments will be described with reference to the drawings.

Embodiment 1

Hereinafter, Embodiment 1 will be described with reference to FIGS. 1A to 5.

Figure 1A:
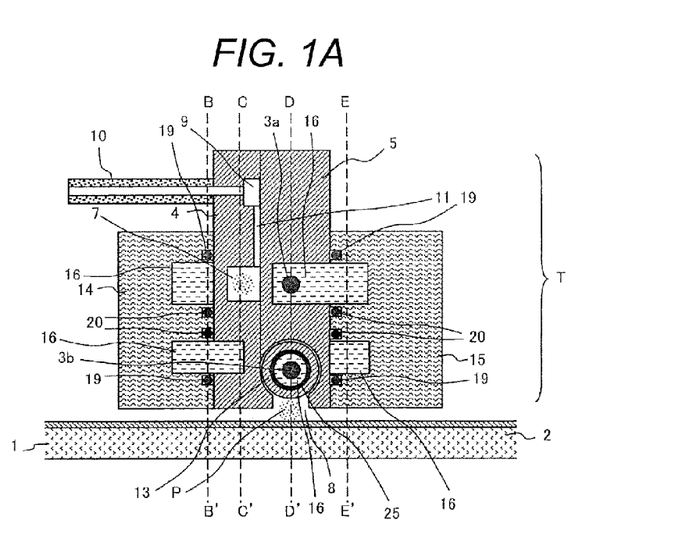
FIGS. 1A to 1E are sectional views illustrating a configuration of a plasma processing apparatus according to Embodiment 1.

FIG. 1A is a sectional view illustrating a configuration of a plasma processing apparatus according to Embodiment 1. FIG. 1A is a sectional view of inductively coupled plasma torch unit T, taken along a plane which is perpendicular to a direction of a line formed by opening 3 and passes dotted line A-A' in FIGS. 1B to 1E and FIG. 2.

Figure 1B:
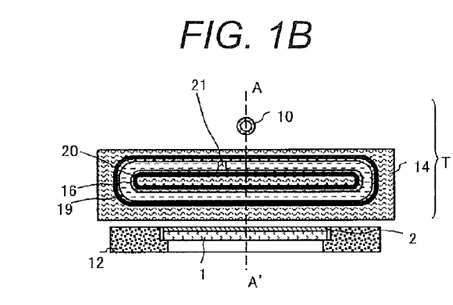
Figure 1C:
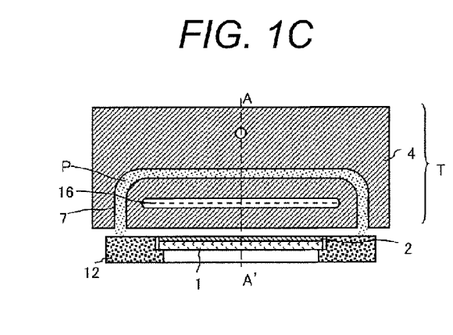
Figure 1D:
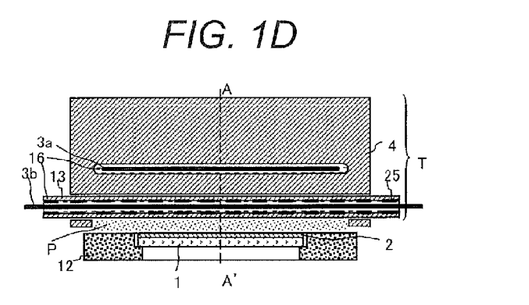
Figure 1E:
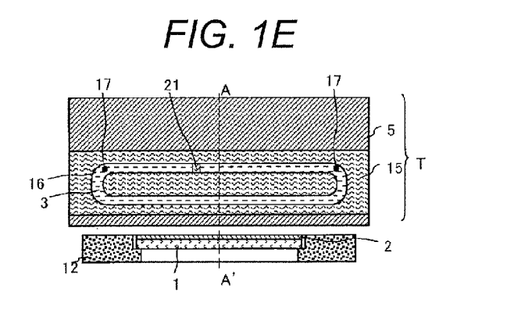

FIGS. 1B to 1E are sectional views of inductively coupled plasma torch unit T, taken along a plane which is parallel to the direction of the line formed by opening 8 and passes dotted lines in FIG. 1A. FIG. 1B is a sectional view taken along dotted line B-B' in FIG. 1A, FIG. 1C is a sectional view taken along dotted line C-C' in FIG. 1A, FIG. 1D is a sectional view taken along dotted line D-D' in FIG. 1A, and FIG. 1E is a sectional view taken along dotted line E-E' in FIG. 1A.

Figure 2:
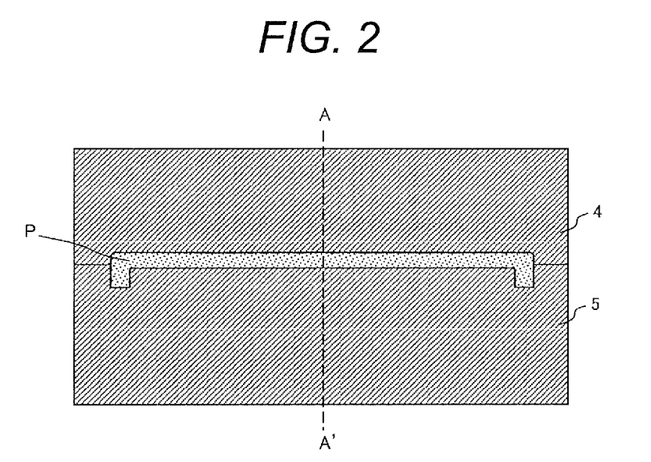
FIG. 2 is a plan view illustrating the configuration of the plasma processing apparatus according to Embodiment 1.
Figure 3:
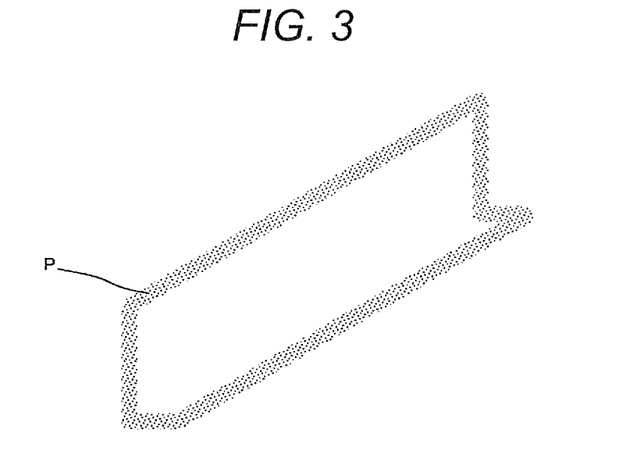
FIG. 3 is a perspective view illustrating a generation region of the plasma according to Embodiment 1.
Figure 4:
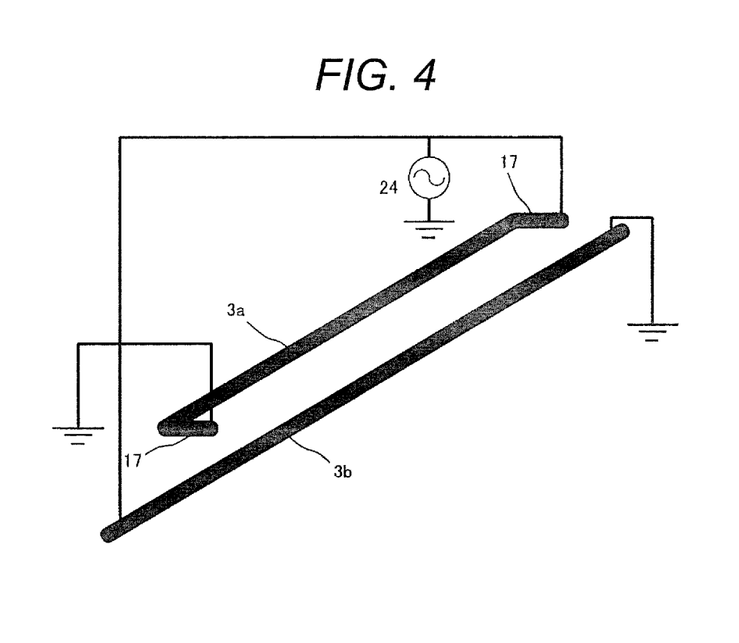
FIG. 4 is a perspective view illustrating a configuration of a coil according to Embodiment 1.
Figure 5:
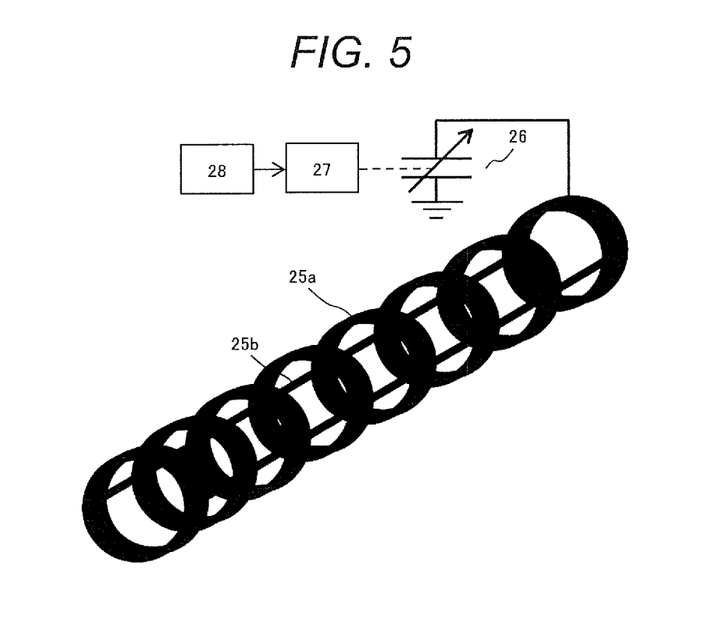
FIG. 5 is a perspective view illustrating a configuration of a shield according to Embodiment 1.

FIG. 2 is a plan view of inductively coupled plasma torch unit T illustrated in FIGS. 1A to 1E when FIG. 1A is viewed from below to above. FIG. 3 is a perspective view illustrating a generation region of plasma viewed from the right front side of FIG. 1A in an oblique downward direction. FIG. 4 is a perspective view illustrating a configuration of a coil viewed from the right front side of FIG. 1A in an oblique downward direction, as similar to FIG. 3. FIG. 5 is a perspective view illustrating a configuration of a shield cylinder viewed from the right front side of FIG. 1A in an oblique downward direction, as similar to FIG. 3.

In FIGS. 1A to 1E, substrate 1 is disposed on tray 12 as a substrate mounting stage and thin film 2 is disposed on substrate 1. In inductively coupled plasma torch unit T, coils 3a and 3b formed of a conductor are arranged in the vicinity of elongated annular chamber 7 which is demarcated by a space surrounded by first ceramic block 4, second ceramic block 5, and tray 12 (or substrate 1 thereon). To be more specific, coils 3 (3a and 3b) have a line shape, coil 3a on a side away from tray 12 is disposed in a groove provided in second ceramic block 5, and coil 3b on a side close to tray 12 is disposed inside ceramic tube 13.

Substrate 1 is disposed on tray 12 as the substrate mounting stage. Coils 3 and chamber 7 are arranged along a plane substantially perpendicular to a plane formed by tray 12.

Inductively coupled plasma torch unit T is entirely surrounded by a shield member (not illustrated) made of a conductor which is grounded, thereby making it possible to effectively prevent high-frequency leakage (noise), and to effectively prevent unfavorable abnormal discharges or the like.

Chamber 7 is surrounded by an annular groove formed by a series of grooves provided in first ceramic block 4 and second ceramic block 5. In other words, the entirety of chamber 7 is configured to be surrounded by a dielectric. In addition, chamber 7 has an annular shape. Here, the annular shape means a series of closed string-like shapes. According to the present embodiment, chamber 7 has a series of closed string-like shapes formed by connecting a straight line portion forming a long side provided on first ceramic block 4, straight line portions forming two short sides arranged on both ends of the straight line portion provided on first ceramic block 4, and a straight line portion forming a long side provided in the lowest portion of second ceramic block 5.

In other words, chamber 7 includes a linear region (straight line portion forming a long side provided in the lowest portion of second ceramic block 5) adjacent to linear opening 8 and two linear regions (straight line portion forming a long side provided on first ceramic block 4) formed of linear regions arranged parallel to the liner region adjacent to the linear opening.

In addition, an inner wall of annular chamber 7, which constitutes opening 8, is a portion through which ceramic tube 13 is exposed toward opening 8 and has a linear shape. Therefore, in a region (the vicinity of opening 8) in which substrate 1 is irradiated with plasma, since the distance between substrate 1 or tray 12 and an inner wall surface of chamber 7 is constant, it is possible to perform uniform processing. In addition, chamber 7 is flat and opening 8 is opened by cutting a part of the dielectric surrounding chamber 7 in a straight line shape.

In addition, coils 3 are formed of two linear conductors arranged along only two linear regions. In other words, coils 3 are not provided along the two straight line portions as short sides. In the inductively coupled plasma torch of the related art, it is common to provide a helical coil so as to wind a cylindrical chamber. In other words, the coil is disposed along the entirety of the chamber.

In addition, in a new elongated type (which realizes linear plasma processing) of inductively coupled plasma torch disclosed in Jpn. J. Appl. Phys. 52 (2013) 05EE01, by T. Okumura and H. Kawaura in the related art, a coil is disposed along the entirety of the chamber. It is clearly proven in the beginning of the specification by the inventors that it is possible to generate thermal plasma without a problem even with the coil shape as in the present embodiment. In such a chamber having two long sides and two short sides, it is possible to obtain intended plasma only by arranging a coil only along the long side as a further elongated region.

When a coil is helical or spiral-shaped as in the related art, it is not possible to dispose the coil in a cylinder; however, as described in the present embodiment, since the coil has a linear shape, there is a significant advantage in that it is possible to dispose the coil in a rotating cylinder.

As illustrated in FIG. 4, high-frequency powers in opposite directions (opposite phases) are applied to coils $3a$ and $3b$ in the longitudinal direction of opening 8. Here, a case where one high-frequency power supply is diverged is described as an example; however, two high-frequency power supplies may be subjected to a synchronized operation by appropriately using a phase shifter or the like. Since coils $3a$ and $3b$ configure a parallel circuit, combined inductance is decreased and thus there is an advantage that a driving voltage is likely to become small.

Copper rods 17 as connection portions continuous in a direction perpendicular to coil $3a$ are provided on both ends of coil $3a$ and electrical connection to an external unit is performed. In comparison, coil $3b$ penetrates through ceramic tube 13 and penetrates though a rotary mechanism configured by a rotary joint or the like, and electrical connection to the external unit is performed.

Plasma P generated in chamber 7 is ejected toward substrate 1 through a plasma electing port (linear opening 8 forming the long side provided in the lowest portion of second ceramic block 5) which forms the lowest portion of chamber 7. In addition, the longitudinal direction of chamber 7 is parallel to the longitudinal direction of opening 8.

A rectangular groove provided in first ceramic block 4 is gas manifold 9 and a porous ceramic member is fitted therein. A gas supplied to gas manifold 9 from gas supply piping 10 is introduced into chamber 7 through gas supply hole 11 as a gas introducing portion positioned between the groove provided in first ceramic block 4 and a flat portion of second ceramic block 5.

Such a configuration enables uniform gas flow in the longitudinal direction to be simply realized. The flow rate of the gas which is introduced to plasma gas supplying piping 10 is controlled by including a flow controlling apparatus such as a mass flow controller on the upstream of the piping. In addition, the inside of gas manifold 9 is formed of a porous ceramic material, thereby making it possible to realize uniform gas flow, and making it possible to prevent abnormal discharges in the vicinity of gas manifold 9.

As gas supply hole 11, a plurality of round hole-like portions are provided in the longitudinal direction; however, a linear slit may be provided in the longitudinal direction.

Cylindrical ceramic tube 13 is provided between first ceramic block 4 and second ceramic block 5 and the top surface of the lowest portion of chamber 7 is disposed to be configured by ceramic tube 13. In other words, a portion configuring a surface of the dielectric member surrounding chamber 7, which faces tray 12, is formed of a cylinder disposed parallel to the line direction of opening 8. In addition, there is provided a rotation mechanism that rotates ceramic tube 13 about the axis thereof.

Further, ceramic tube 13 is a tube in which a cavity is provided and a mechanism that causes a refrigerant to flow into the cavity therein is provided. As the rotation mechanism, it is desirable that a highly accurate rotation guide is provided such that the shape of chamber 7 is not changed due to the rotation of ceramic tube 13 and rotary power of a motor or the like is transmitted by a mechanism such as belt drive or the like. In addition, it is possible to use a rotary joint such that it is possible to rotate the tube while the refrigerant flows therein.

Linear coil $3b$ is provided inside rotating cylindrical ceramic tube 13 along the axis of the cylinder. Such an arrangement enables the distance between coil $3b$ and the straight line portion of chamber 7 that communicates with and is adjacent to opening 8 to be decreased. In other words, it is possible to achieve an arrangement in which the distance between coils 3 and chamber 7 is shortened. This significantly contributes to improvement of plasma generation efficiency. In other words, it is possible to realize fast and efficient plasma processing.

Refrigerant flow path 16 surrounded by first ceramic block 4 and third ceramic block 14 is provided and cooling of first ceramic block 4 is performed. In addition, as coil $3a$, a copper rod having a circular cross section is disposed inside refrigerant flow path 16 surrounded by second ceramic block 5 and fourth ceramic block 15. Coil 3 may be a hollow tube and may supply and discharge a refrigerant as a separate system from refrigerant flow path 16.

In this manner, a refrigerant such as water is caused to flow through refrigerant flow path 16, thereby making it possible to cool coils 3 and ceramic members. Since first ceramic block 4 and second ceramic block 5 need to have good heat resistance, ceramics containing silicon nitride as a main component, or ceramics containing silicon, aluminum, oxygen and nitrogen as main components are appropriate for the blocks. Since third ceramic block 14 and fourth ceramic block 15 do not need to have good heat resistance, relatively low-cost ceramics containing aluminum oxide (alumina) or the like can be used.

Copper rod 17 is fixed to fourth ceramic block 15 by a joint (not illustrated) and can be configured such that the refrigerant does not leak. Outer O-ring 19 and inner O-ring 20 are arranged between first ceramic block 4 and third ceramic block 14, and between second ceramic block 5 and fourth ceramic block 15, and are configured such that the refrigerant does not leak.

As illustrated in FIG. 1B, refrigerant flow path 16 is partitioned in the inside by partition 21 and forms a series of flow paths. In the configuration, the orientation of a high-frequency current flowing through coils 3 is parallel to the orientation of flow of the refrigerant flowing in refrigerant flow path 16. In addition, as understood in FIGS. 2 and 3, generated plasma P has the same shape as a three-dimensional outer edge, in which two rectangles having equal length in the line direction of opening 8 have an L shape. In this manner, plasma P has a slightly distorted shape compared to the related art and, thus, chamber 7 and ceramic tube 13 need to be disposed so as not to interfere with each other.

Plasma gas is supplied into chamber 7, and ejected toward substrate 1 from opening 8, and the high-frequency power is supplied to coils 3 by high-frequency power supply 24, thereby generating plasma P in chamber 7 and substrate 1 is irradiated with plasma P from opening 8, thereby making it possible to perform plasma processing on thin film 2 on substrate 1. Chamber 7 and tray 12 are caused to relatively move having an orientation (typically orientation perpendicular to) intersecting with the line direction (longitudinal direction) of opening 8, thereby processing substrate 1. In other words, inductively coupled plasma torch unit T or tray 12 moves in a rightward-leftward direction in FIGS. 1A to 1E.

When the distance between inductively coupled plasma torch unit T and substrate 1 is decreased so as to perform efficient processing on substrate 1, an inner wall surface of a portion (portion facing tray 12) of chamber 7 in the vicinity of tray 12 on a side opposite to tray 12 receives the highest heat amount. Therefore, in order to suppress an increase in the damage, effective cooling of the components needs to be performed. Hence, in the present embodiment, a configuration, in which ceramic tube 13 having refrigerant flow path 16 therein is used, is employed. Ceramic tube 13 has a cylindrical shape, thereby making it possible to secure high strength and the pressure of the refrigerant is increased therein. Thus, it is possible to cause a large amount of refrigerant to flow.

In addition, in the configuration, ceramic tube 13 is caused to rotate, thereby generally replacing a surface receiving heat from plasma P. In other words, a portion receiving the heat from plasma P and having a high temperature moves to a position which does not rapidly receive the heat from plasma P due to the rotation, and is rapidly cooled. Therefore, it is possible to apply significantly high high-temperature power compared to the related art, thereby making it possible to perform fast plasma processing.

As the plasma gas supplied into chamber 7, it is possible to use various gases; however, when the stability of plasma, ignitability, and the service life of a member exposed to the plasma are considered, it is desirable to use an inert gas, and, in particular, a rare gas, as the main agents. Among the gases, Ar gas is typically used. In a case where the plasma is generated only by Ar, the plasma has a significantly high temperature (10000 K or more)

According to the plasma processing apparatus, Ar or Ar+$H_2$ gas is supplied as a plasma gas into chamber 7, the gas is ejected toward substrate 1 from opening 8, high-frequency power supply 24 of 13.56 MHz is supplied to coil 3, thereby causing plasma P to be generated by causing high-frequency electromagnetic field to be generated in chamber 7, and making it possible to perform thermal processing such as crystallization of a semiconductor film by irradiating and scanning substrate 1 with plasma P from opening 8.

As conditions of plasma generation, the distance between opening 8 and substrate 1 is 0.1 mm to 5 mm, a scanning speed is 20 mm/s to 3000 m/s, a total plasma flow rate is 1 SLM to 100 SLM, $H_2$ concentration in Ar+$H_2$ gas is 0% to 10%, and high-frequency power is appropriately a value of about 0.5 kW to 30 kW. Here, the gas flow rate and power of the various amount are a value per 100 mm of opening 8.

A parameter such as the gas flow rate or the power is considered being fed by the amount proportional to the length of opening 8.

In this manner, according to the present embodiment, it is possible to perform feeding of the high high-frequency power. In other words, when the high-temperature thermal processing is uniformly performed in the vicinity of the surface of the substrate only for a short time, or when the substrate is irradiated with plasma using a reactant gas or is irradiated with the plasma and flow of the reactant gas at the same time and the substrate is subjected to low-temperature plasma processing, it is possible to perform fast processing and it is possible to stably use the plasma. In other words, since it is possible to operate by using significant power, irradiation strength of the plasma is increased and, as a result, high processing speed (the number of substrates which can be processed per unit time) is achieved.

As described above, in the configuration of the related art, a problem arises in that electrostatic damage occurs on the substrate due to the high-frequency electromagnetic field generated by a coil. In addition, multiple unstable streamer discharges are produced to have an orientation perpendicular to the line direction of linear thermal plasma (plasma in the vicinity of an opening) applied to the substrate and result in a defective phenomenon such as arcing. It is considered that phenomenon occurs due to the occurrence of inductively coupled discharges and, simultaneously, the occurrence of weak capacitively coupled discharges.

In an inductively coupled plasma source, as a configuration, in which capacitively coupled electric field (electric field in a normal line direction of the wire of the coil) in the vicinity of the coil is weak and a capacitive coupling between the coil and plasma is weak, Faraday shield has been long known. The Faraday shield is configured of multiple conductor lines arranged to have an orientation intersecting with the wire of the coil, as described in Japanese Patent Unexamined Publication No. 2002-237489. However, in a thermal plasma torch as in the application, use of the annular chamber and use of the linear coil are not considered in the related art.

Hence, the inventers have devised a Faraday shield structure in which shield cylinder 25 as illustrated in FIGS. 1A to 1E and FIG. 5 is used.

In the drawing, a shield is provided around the wire configuring the coil and is formed of multiple conductor lines 25a arranged to have an orientation intersecting with the line direction formed by the coil. One conductor line 25a has a circular shape and the conductor lines are arranged at equal intervals along the straight line, and coil 3b is disposed in the vicinity of the center of the circles. Since the plurality of conductor lines 25a have equal potential, conductivity is intended by connection line 25b. Since the high high-frequency voltage is applied to coil 3b, discharges between coil 3b and shield cylinder 25 are prevented. Therefore, it is preferable that a refrigerant which is high in insulating properties except water, for example, insulating oil, or Galen flows through refrigerant flow path 16 inside ceramic pipe 13.

Since coil 3a on the side away from tray 12 is sufficiently separated from substrate 1 or opening 8, a Faraday shield is not disposed around the coil; however, in order to further reliably suppress an increase in capacitive coupling, a shield cylinder having the same structure as around coil 3b may be provided around coil 3a on the side away from tray 12.

Shield cylinder 25 is grounded through variable capacitor 26. Capacitance of variable capacitor 26 is changed due to the rotation of motor 27. Motor 27 is positioned following an instruction from capacitor control device 28. In the inductively coupled plasma source, ignition of the discharges occurs with capacitive coupling. Therefore, from when the high-frequency power is applied until the discharges ignite, the capacitance of variable capacitor 26 is set to be low (for example, 200Ω or higher).

At this time, since a voltage of tens of % of the voltage applied to coil 3b is applied to shield cylinder 25, the shield cylinder has good ignitibility. After a photodiode (not illustrated) or the like detects ignition at once, a value of instruction from capacitor control device 28 is changed such that the capacitance of variable capacitor 26 is increased (for example, 20Ω or lower). At this time, since the potential of shield cylinder 25 approximates to the ground potential, effects of shielding (blocking) capacitive coupling are enhanced. Subsequently, the types of gases are changed or the high-frequency power is increased, a mode jump to inductively coupled discharges is performed, and then the plasma processing is performed on the substrate.

Otherwise, until the mode jump to the inductively coupled discharges is performed, the capacitance of the variable capacitor may be maintained to be low and the capacitance may be increased immediately before the processing is performed on the substrate. Following such a procedure enables good ignitability and good shielding properties during the substrate processing (state of suppressing an increase in the electrostatic damage or the streamer discharges) to be compatible.

As a configuration in which the compatibility of the ignitability and the shielding properties is achieved without using variable capacitor 26, it is considered that shield cylinder 25 is configured to be able to perform a parallel shift in the axial direction of coil 3b. In other words, after shield cylinder 25 is ignited in a state (state in which shielding properties are substantially lost) in which the shield cylinder is positioned to be separated from the vicinity of opening 3, shield cylinder 25 is subjected to the parallel shift toward the vicinity of opening 8, and it is possible to enhance the shielding properties.

As another configuration in which the compatibility of the ignitability and the shielding properties is achieved without using variable capacitor 26, it is considered that shield cylinder 25 is connected to a second high-frequency power supply different from high-frequency power supply 24 that drives coil 3, in a state in which shield cylinder 25 is insulated from a ground potential in a fixed capacitor. In other words, in the configuration, a high-frequency power is supplied to shield cylinder 25 from the second high-frequency power supply in an ignition sequence, the ignition is performed by the capacitive coupling/power supply from the second high-frequency power supply is stopped after the ignition, and shield cylinder 25 is caused to function as the Faraday shield. In this case, it is also effective to use a method, in which high-frequency power supply 24 is diverged into two ways and one is connected to shield cylinder 25 without using the second high-frequency power supply.

Embodiment 2

Hereinafter, Embodiment 2 will be described with reference to FIG. 6.

Figure 6:
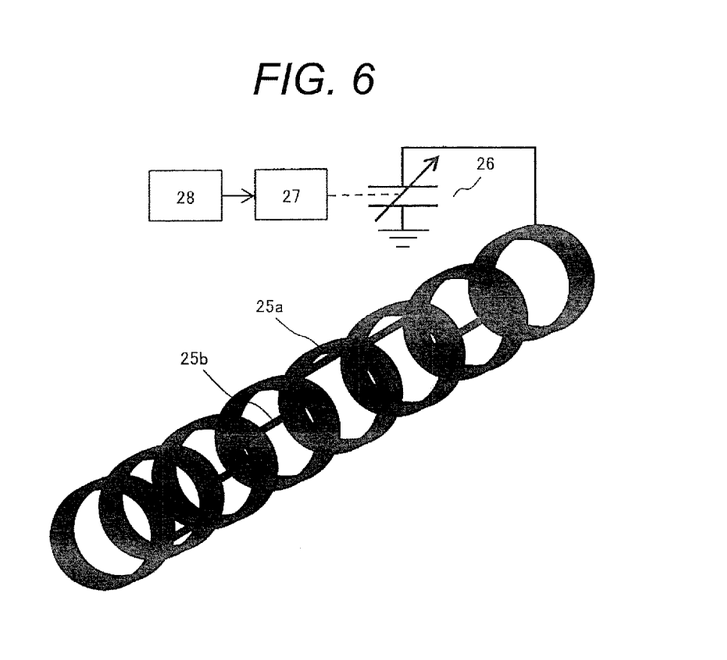
FIG. 6 is a perspective view illustrating a configuration of a shield according to Embodiment 2.

FIG. 6 is a perspective view illustrating a configuration of a shield according to Embodiment 2.

In FIG. 6, unlike Embodiment 1, connection lines 25b for maintaining an equal potential of circular conductor lines 25a are arranged to form a zigzag shape. The zigzag shape means that, when an angle in a circumferential direction of a circle formed by conductor lines 25a is θ, a plurality of connection lines 25b are arranged at different positions of θ.

In a case where a relative-positional relationship between ceramic tube 13 and shield cylinder 25 is fixed, and ceramic tube 13 is caused to rotate, shield cylinder 25 also integrally rotates. At this time, if in the configuration of Embodiment 1, when connection lines 25b reach a position (position closest to the substrate or the tray) immediately below in FIG. 5, an inductive electrical field immediately on the substrate becomes slightly weak. Therefore, the plasma processing is likely to become momentarily weak. In other words, uniformity of the processing is slightly degraded.

In Embodiment 2, since connection lines 25b are arranged to form the zigzag shape, it is possible to effectively suppress an increase in weak discharges immediately on the substrate depending on the rotating position of shield cylinder 25. In other words, it is possible to realize more uniform processing.

Embodiment 3

Hereinafter, Embodiment 3 will be described with reference to FIG. 7.

Figure 7:
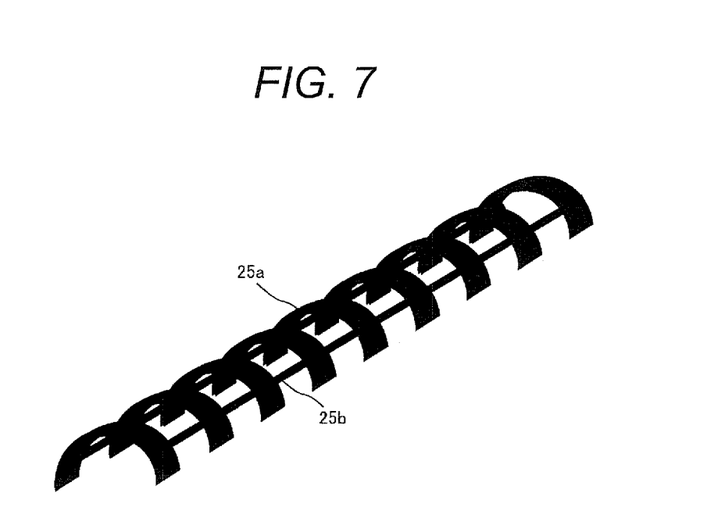
FIG. 7 is a perspective view illustrating a configuration of a shield according to Embodiment 3.

FIG. 7 is a perspective view illustrating a configuration of a shield according to Embodiment 3.

In FIG. 7, unlike Embodiment 1, connection lines 25a are configured to form a semi-circular shape and are aligned to have the same orientation. As a method in which such shield cylinder 25 is used, two ways are considered.

In the first way, an arrangement is achieved such that FIG. 7 is a perspective view obtained when viewed from, below in FIG. 1A in an oblique upward direction. In this case, only the lower side of coil 3b in FIG. 1A is shielded. Thus, similar to Embodiment 1, the shielding properties are changed by using the variable capacitor and compatibility of ignitability and shielding properties is achieved. In this case, the upper side of coil 3b in FIG. 1A is not shielded; however, the shielding properties are sufficiently exhibited in many cases.

In the second way, shield cylinder 25 is normally grounded without being through variable capacitor, and, in the ignition sequence, an arrangement is achieved such that FIG. 7 is a perspective view obtained when viewed from above in FIG. 1A in an oblique downward direction. As a configuration in which the vicinity of opening 8 is substantially not shielded, the ignitability is secured and shield cylinder 25 is caused to rotate by 180 degrees after the ignition. An arrangement is achieved such that FIG. 7 is a perspective view obtained when viewed from below in FIG. 1A in an oblique upward direction and the vicinity of opening 8 is configured to be substantially shielded. In such a configuration, the compatibility of ignitability and shielding properties is also achieved.

Embodiment 4

Hereinafter, Embodiment 4 will be described with reference to FIG. 8.

Figure 8:
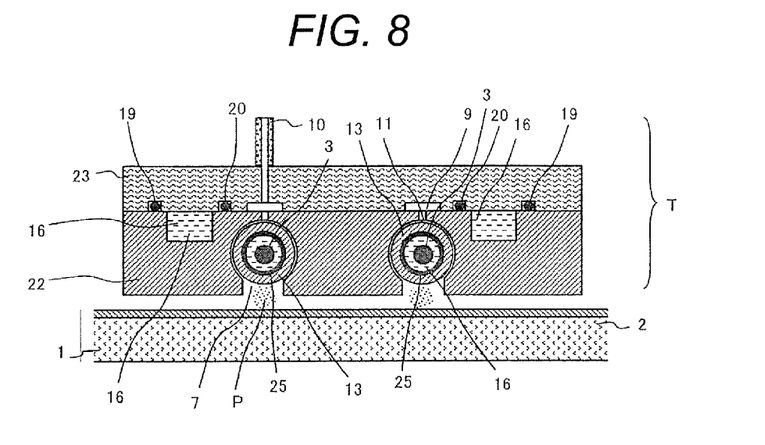

FIG. 8 illustrates a configuration of a plasma processing apparatus according to Embodiment 4, is a sectional view of inductively coupled plasma torch unit T taken along a plane perpendicular to the line direction of opening 8, and corresponds to FIG. 1A.

In FIG. 8, thin film 2 is disposed on substrate 1 counted on tray 12 (not illustrated) as the substrate mounting stage.

In inductively coupled plasma torch unit T, coils 3 formed of two linear conductors are arranged inside cylindrical ceramic tube 13.

Chamber 7 is an annular space parallel to tray 12, which is demarcated by a space surrounded by ceramic tube 13, first ceramic block 22, and substrate 1, and coils 3 and chamber 7 are arranged along a plane substantially parallel to a plane formed by tray 12. As a configuration of shield cylinder 25, it is possible to use the same configuration as that of any of Embodiments 1 to 3.

According to the present embodiment, since substrate 1 is close to the elongated thermal plasma and, in the configuration, substrate 1 is directly irradiated with the plasma using both sides of two long straight line portions constituting elongated chamber 7, the gas and the high-frequency power are highly efficiently used. In other words, since substrate 1 is irradiated with twice the plasma by one time of scanning, it is possible to perform the plasma processing in a shorter period of time. When high-temperature thermal processing is uniformly performed on the vicinity of the surface of the substrate only for a short period of time, or when the substrate is irradiated with plasma using a reactant gas or is irradiated with the plasma and flow of the reactant gas at the same time and the substrate is subjected to the low-temperature plasma processing, it is possible to perform fast processing and it is possible to stably use the plasma. In addition, similar to Embodiments 1 to 3, the compatibility of ignitability and shielding properties is also achieved.

Embodiment 5

Hereinafter, Embodiment 5 will be described with reference to FIGS. 9 to 10.

Figure 9:
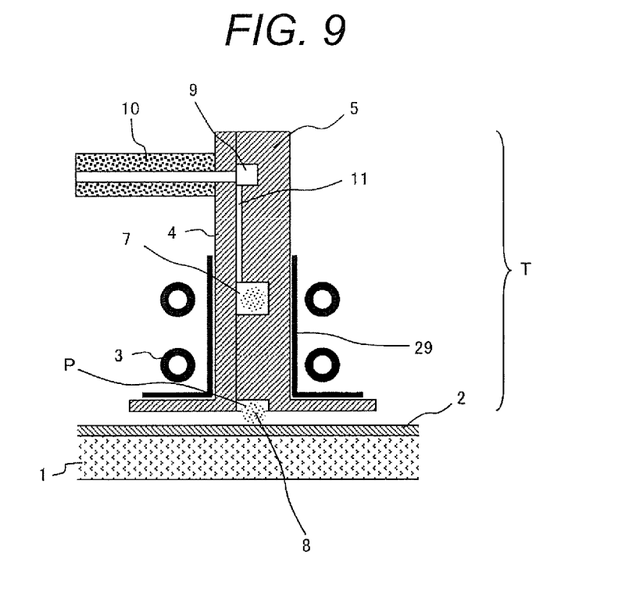
FIG. 9 is a sectional view illustrating a configuration of a plasma processing apparatus according to Embodiment 5.

FIG. 9 illustrates a configuration of a plasma processing apparatus according to Embodiment 5, is a sectional view of inductively coupled plasma torch unit T taken along a plane perpendicular to the line direction of opening 8, and corresponds to FIG. 1A. FIG. 10 is a view of an assembly configuration of inductively coupled plasma torch unit T illustrated in FIG. 9 and also shows a perspective view of the components (a part).

Figure 10:
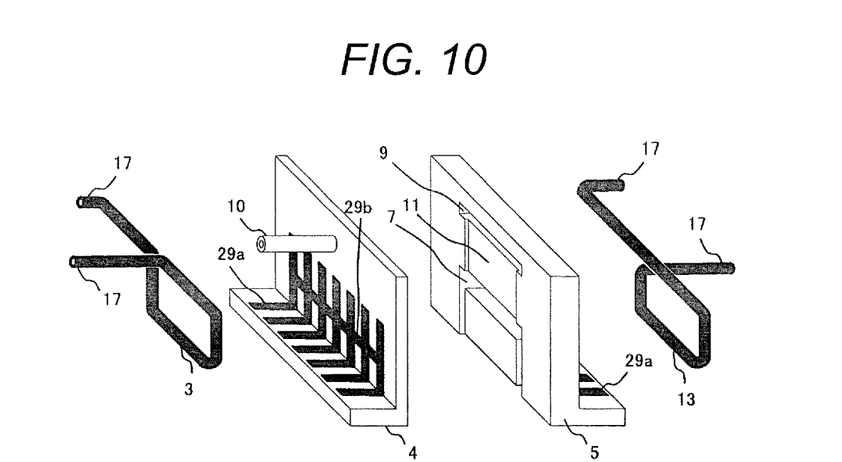
FIG. 10 is a perspective view illustrating the configuration of the plasma processing apparatus according to Embodiment 5.

In FIGS. 9 and 10, unlike Embodiments 1 to 4, rotating ceramic tube 13 is not provided. In the configuration, Faraday shield 29 is added to the configuration disclosed in Jpn. J. Appl. Phys. 52 (2013) 05EE01, by T. Okumura and H. Kawaura in the related art. In other words, Faraday shield 29 is provided between coils 3 and first and second ceramic blocks 4 and 5. Since Faraday shield 29 includes multiple conductor lines 29a arranged to have an orientation intersecting with the line direction of the coil and maintains the potential equal to conductor lines 29a, the Faraday shield achieves conductivity by connection line 29b. In addition, one conductor line 29a forms an L shape and coil 3 is disposed inside the conductor lines.

It should be noted that the plasma processing apparatus and method described above are only exemplary embodiments. Other embodiments and/or modifications are within the scope of the claimed apparatus and method.

For example, inductively coupled plasma torch unit T may perform scanning over fixed tray 12, or tray 12 may perform scanning with respect to fixed inductively coupled plasma torch unit T.

In addition, the chamber includes two linear regions of one linear region adjacent to the linear opening and the other linear region disposed parallel to the one linear region. A case, where the coil is formed of two linear conductors disposed along only two linear regions, is described as an example; however, in a case where the coil is configured by the ceramic tube rotating the linear region adjacent to the linear opening, a part of the coil is disposed therein, good design flexibility is achieved by the linear coil even though the region of the chamber except the linear regions is not linear (arbitrary curve), and it is possible to highly efficiently generate the plasma. In the configuration of the case, the chamber includes the linear region adjacent to the linear opening, a portion constituting a surface of the dielectric member surrounding the chamber, which faces the substrate mounting stage, is formed of a cylinder disposed parallel to the line direction of the opening, a rotation mechanism that rotates the cylinder about the axis of the cylinder is provided, and a part of the coil is disposed in the cavity inside the cylinder.

In addition, according to the various embodiments, it is possible to perform high-temperature processing on the vicinity of the surface of substrate 1. In this manner, the apparatus and method are applicable to improvement of crystallization of a TFT-target semiconductor film or a solar cell-target semiconductor film which is described in the related art. Of course the apparatus and method are applicable to various types of surface processing such as annealing such as oxidation of a silicon semiconductor integrated circuit, activation, or silicide formation, cleaning or degassing reduction of a protective layer of a plasma display panel, surface flattening or degassing reduction of a dielectric layer made of aggregation of silica micro-particles, reflow of various electronic devices, or plasma doping using a solid impurity source.

In addition, the apparatus and method are also applicable to, as a method for manufacturing a solar cell, a method in which a substrate is coated with powder obtained by pulverizing a silicon ingot, irradiation with plasma is performed such that the powder is melted, and a polycrystalline silicon film is obtained.

In addition, the term, "thermal plasma" is used for simplification in the description; however, it is difficult to exactly classify the thermal plasma and the low-temperature plasma, and, for example, as explained in "Non-Equilibrium In Thermal Plasma" in journal of plasma and fusion research Vol. 82, Mo. 8 (2006), pp. 479 to 483 by Yasunori Tanaka, it is difficult to classify the types of plasmas only by the thermal equilibrium.

A concern of the present disclosure is performing the thermal processing on the substrate, and is applicable to any method relating to a technology of irradiation of high-temperature plasma regardless of the terms such as thermal plasma, the thermal equilibrium plasma, or high-temperature plasma. As described above, in the inductively coupled plasma torch, two modes of weak discharges and strong discharges are provided; however, the strong discharges can also be effectively used.

In addition, the case in which high-temperature thermal processing is uniformly performed on the vicinity of the surface of the substrate only for a short period of time is described in detail; however, the apparatus and method are applicable to the case where the substrate is irradiated with plasma using the reactant gas or is irradiated with the plasma and flow of the reactant gas at the same time and the substrate is subjected to the low-temperature plasma processing. The plasma gas and the reactant gas are mixed, thereby irradiating the substrate with plasma by the reactant gas and making it possible to realize etching or CVD.

Otherwise, as the plasma gas, a rare gas or a gas obtained by adding a little amount of $H_2$ gas to the rare gas is used and a gas containing the reactant gas as a shield gas is supplied, thereby irradiating the substrate with the plasma and flow of the reactant gas at the same time, and making it possible to realize the plasma processing such as etching, CVD, or doping. When a gas containing argon as a main component is used as the plasma gas, the thermal plasma is generated as described in the examples in detail.

When a gas containing helium as a main component is used as the plasma gas, it is possible to generate relatively low-temperature plasma. In such a method, it is possible to perform the processing such as etching or deposition with slightly heating the substrate. As the reactant gas used in etching, there is exemplified a halogen containing gas including, for example, $C_xF_x$ (x and y are natural numbers), $SF_6$, or the like, and it is possible to perform the etching on silicon, a silicon compound, or the like. When $O_2$ is used as the reaction gas, it is possible to remove an organic substance, resist ashing, or the like. As the reaction gas used in the CVD, monosilane, disilane, or the like is used and it is possible to form a film of silicon or a silicon compound.

Otherwise, when a mixed gas of an organic gas containing silicon represented by tetraethoxysilane (TEOS) and $O_2$ is used, it is possible to form a silicon dioxide film. Besides, it is possible to perform various types of low-temperature plasma processing such as surface processing for improving water-repellent properties or hydrophilic properties.

When compared to the technology in the related art using the capacitively coupled atmospheric pressure plasma, in the inductively coupled type used in plasma processing apparatus, it is difficult to fulfil are discharges even when power is input per unit area at high density and it is possible to generate the plasma having higher density. As a result, fast reaction speed is obtained, and it is possible to efficiently perform processing on the entirety of the desirable processing-target region of the substrate in a short time.

The plasma processing apparatus as described above can be used for manufacturing various electronic devices and, for example, is applicable to improvement of crystallization of a TFT-target semiconductor film or a solar cell-target semiconductor film. According to the apparatus, fast processing can be performed for various types of surface processing such as activation annealing of a semiconductor, cleaning or degassing reduction of a protective layer of a plasma display panel, surface flattening or degassing reduction of a dielectric layer made of aggregation of silica micro-particles, reflow of various electronic devices, or plasma doping using a solid impurity source and it is possible to stably use the plasma.

In addition, in the manufacturing various electronic devices, in low-temperature plasma processing such as etching, film formation, doping, or surface improvement, the invention is applicable to efficient processing on the entirety of the desirable processing-target region of the substrate in a short time.

What is claimed is:

1. A plasma processing apparatus that uses an inductively coupled plasma torch, the apparatus comprising:
    an annular chamber that has a linear opening, is surrounded by a dielectric member except for the opening, and communicates with the opening;
    a coil provided in a vicinity of the chamber;
    a power supply connected to the coil;
    a substrate mounting stage; and
    a shield that is formed of multiple conductor lines arranged to have an orientation intersecting with a direction of a line formed by the coil and is provided around a wire constituting the coil.

2. The plasma processing apparatus of claim 1, wherein a portion constituting a surface of the dielectric member surrounding the chamber, which faces the substrate mounting stage, is formed of a cylinder disposed parallel to the line direction of the opening.

3. The plasma processing apparatus of claim 2, wherein a part of the coil is disposed in a cavity inside the cylinder.

4. The plasma processing apparatus of claim 1, wherein the shield is grounded through a variable capacitor.

5. The plasma processing apparatus of claim 2, wherein the cylinder is configured to be rotatable around the coil.

6. A plasma processing apparatus that uses an inductively coupled plasma torch, the apparatus comprising:
    an annular chamber having a linear opening, the chamber surrounded by a dielectric member except for the opening, and communicates with the opening;
    a cylinder provided in a vicinity of the chamber and disposed to be in parallel to a line direction of the opening;
    a coil provided in the cylinder, the coil connected to a high-frequency power supply; and
    a shield provided on the cylinder, the shield including a plurality of conductor lines arranged to have an orientation intersecting with a direction of a line formed by the coil.

7. The plasma processing apparatus of claim 6, wherein the plurality of conductor lines includes a first plurality of circular or semi-circular shaped conductor lines and at least one straight conductor line extending between at least two of the first plurality of circular or semi-circular shaped conductor lines.

8. The plasma processing apparatus of claim 6, wherein the shield is connected to another high-frequency power supply different from the high-frequency power supply connected to the coil.

* * * * *